(12) United States Patent
Yang et al.

(10) Patent No.: US 9,331,845 B2
(45) Date of Patent: May 3, 2016

(54) SYSTEM AND METHOD FOR CHIP SYSTEM TIMING COMPENSATION

(75) Inventors: Shu-Chun Yang, Xihu Township (TW); Wei Chih Chen, Hsinchu (TW); Mu-Shan Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 80 days.

(21) Appl. No.: 13/537,110

(22) Filed: Jun. 29, 2012

(65) Prior Publication Data
US 2014/0003551 A1   Jan. 2, 2014

(51) Int. Cl.
*H04L 7/00* (2006.01)
*H04L 7/033* (2006.01)
*H03L 7/081* (2006.01)

(52) U.S. Cl.
CPC ............ *H04L 7/0337* (2013.01); *H03L 7/0814* (2013.01); *H04L 7/0037* (2013.01)

(58) Field of Classification Search
CPC ........ G11C 7/222; G11C 7/22; G11C 7/1066; H03L 7/08
USPC .......... 375/376, 354, 371; 327/158, 161, 141, 327/147; 365/233.1, 194, 193, 189.17
See application file for complete search history.

(56) References Cited

U.S. PATENT DOCUMENTS

| | | | |
|---|---|---|---|
| 8,379,457 B1 * | 2/2013 | Chen | 365/185.23 |
| 2005/0185742 A1 * | 8/2005 | Liu | 375/348 |
| 2011/0075456 A1 * | 3/2011 | Tan et al. | 363/74 |
| 2011/0235764 A1 * | 9/2011 | Ware et al. | 375/362 |

* cited by examiner

*Primary Examiner* — Leila Malek
(74) *Attorney, Agent, or Firm* — Duane Morris LLP

(57) ABSTRACT

A system and method is disclosed for adjusting for timing variations between a data signal and an associated data read signal being transmitted from a first chip and received on a second chip.

21 Claims, 10 Drawing Sheets

SYSTEM AND METHOD FOR CHIP SYSTEM TIMING COMPENSATION

BACKGROUND

Typical implementations of multi-chip circuits generally require that certain functions of the various chips be performed at specific times or within specific time frames. Generally there may be timing circuitry associated with the multi-chip circuit that provides a timing signal to one or more of the chips in the circuit. Maintaining consistent timing between chips in a multi-chip circuit can present problems that may require relatively costly solutions. The requirement for consistent timing becomes all the more profound when the chips have a tight timing budget and/or high speed operation of the chips is needed. A non-limiting example includes the use of double data rate ("DDR") chips.

Compensating for timing variations that occur between chips are typically handled in various ways, such as by supplying a clock signal to each chip, providing a phase lock loop ("PLL") or a delay-locked loop ("DLL") to certain chips in the circuit, or providing a digitally controllable delay line ("DCDL") that is calibrated through clock and data training with built-in self test circuitry. These solutions are not attractive since they are costly, add unnecessary complexity, and/or require a relatively large amount of power. These solutions are even more unattractive when the multi-chip circuit is a low-power circuit such as for low-power e-DRAM chips.

Multi-chip circuits may include 2.5D or 3D architectures or 3D chip stacks (sometimes referred to herein as "3D stack", "3D IC", "stack of dies") which encompass architectures where chips are positioned on more than one plane and may be integrated both horizontally and vertically into a single circuit, such as a system on a chip. These multi-chip arrangements may also include a through-silicon via ("TSV") or interposer, as is known in the art. Additionally, 3D ICs also encompass the situation where there exists more than one vertical stack of chips in the circuit. Furthermore, the chips in a 3D IC may be of different varieties, such as, but not limited to, processors, memory (of various types and capacities), digital signal processors ("DSP"), radio frequency ("RF") modules, etc., as would be familiar to those of skill in the art.

DETAILED DESCRIPTION

With reference to the figures where like elements have been given like numerical designations to facilitate an understanding of the present subject matter, various embodiments of a system and method for compensating for timing misalignments are described. In order to more fully understand the present subject matter, a brief description of applicable circuitry will be helpful.

Figure 1:
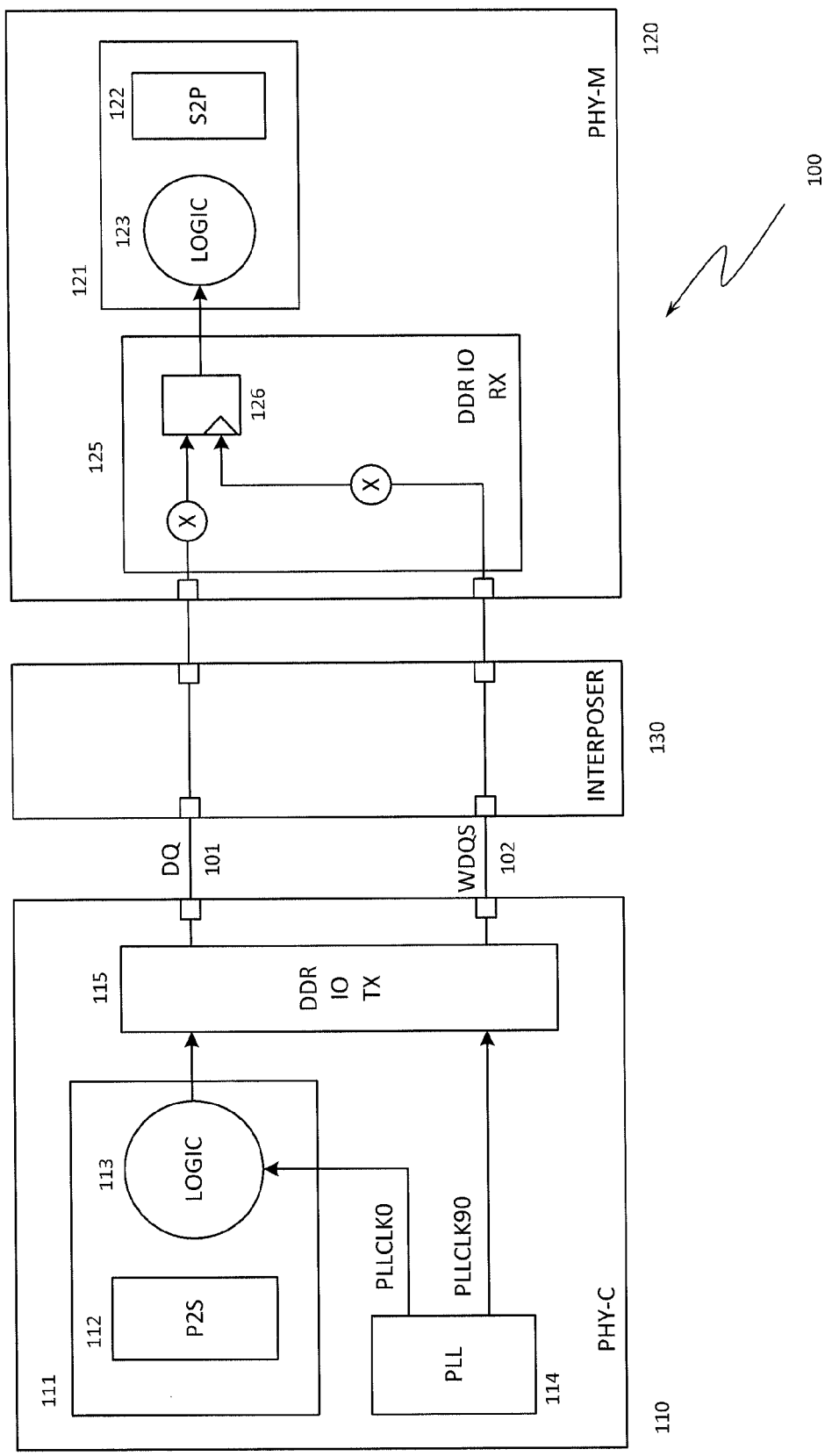
FIG. 1 is an illustration of a functional block diagram of an applicable circuit known in the art showing similar delays for the data and clock lines between two chips.

FIG. 1 is an illustration of a functional block diagram 100 of an existing circuit showing similar delays (annotated by the symbol $\hat{X}$ referred to herein as "Delay X"—note that Delay X is conceptual in nature and does not represent a discrete circuit element nor a particular location where Delay X is incurred) for the data line 101 and clock line 102 between two chips 110 and 120. The chips may be separated by an interposer 130. The chips may be, for example, part of a low-power e-DRAM (embedded dynamic random-access memory) circuit which may be a DDR (double data rate) circuit, as is known in the art, but the present subject matter is not so limited as would be obvious to those of skill in the art. The interposer 130 may be a 2.5D interposer as is known in the art.

With respect to other Figures described below, different delay values will be represented by a symbol similar to the symbol above for Delay X, albeit with a different letter within the circle.

Chip 110 includes a circuit element 111 which includes a parallel to serial converter 112 for serializing input data (not shown) and logic circuitry 113 which receives a clock signal PLLCLK0 from phase lock loop 114 and outputs data to a transmission device 115. The transmission device 115 receives a clock signal PLLCLK90 from the phase lock loop 114. Typically, PLLCLK90 is offset (usually by 90°, or ¼ cycle) from PLLCLK0. The transmission device 115 transmits a data signal via line 101 and a timing clock signal via line 102 through interposer 130 to chip 120 where a receiving device 125 receives the data signal from line 101 and the clock signal from line 102. Sampling circuitry 126 in the receiving device 125 uses the clock signal from line 102 to sample the data signal from line 101, as is known in the art. Since both the data signal on line 101 and the clock signal on line 102 incur the same, or approximately the same, delay (i.e., Delay X), the data signal is sampled at a proper time such that the correct data value in the data signal on line 101 is sampled (e.g., no intersymbol interference occurs). The sampled data is then sent to circuit element 121 where it is acted upon by logic circuitry 123 and sent to a serial to parallel converter 122 for further processing which is not germane to the present subject matter.

Figure 2:
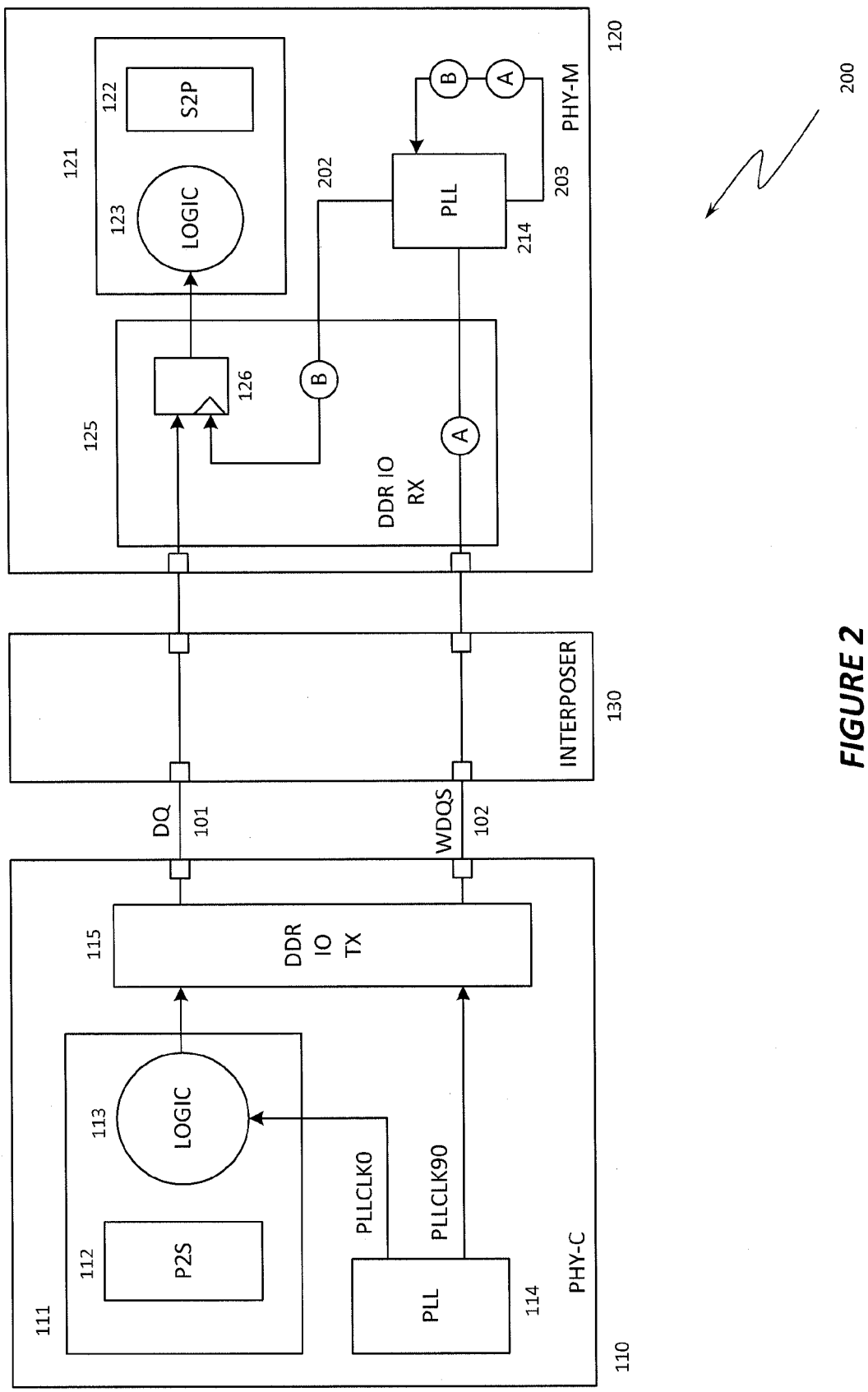
FIG. 2 is an illustration of a functional block diagram including an additional applicable circuit known in the art for a calibration path.

FIG. 2 is an illustration of a functional block diagram 200 according to FIG. 1 including an additional existing approach for circuitry for a calibration path. As can be seen in a comparison with FIG. 1, FIG. 2 includes, in chip 120, a phase lock loop 214 which has as an input clock line 102 and has an output clock line 202 which is input to the sampling circuit 126. Additionally, the phase lock loop 214 is shown with a loop 203 which will be discussed in more detail below. Phase lock loop 214 is part of the existing approach for circuitry for a calibration path which is included in the functional block diagram 200 to compensate for delay differences between line 101 (the data line) and lines 102 and 202 (which together comprise the complete clock line) as those lines are input into sampling circuit 126. This difference in delay is shown conceptually as the combination of Delay A in line 102 and Delay B in line 202. As with Delay X above, Delay A and Delay B are each conceptual in nature and do not represent a discrete circuit element nor a particular location where their respective conceptual delays are incurred.

The Delay A and Delay B values are generally dependent on process and/or path parameters and variations. Compensating for and/or correcting the differences in delay in the data and clock lines (sometimes known in the art as skew) at the sampling circuitry 126 is an important consideration which becomes more critical as data rates through the chips 110 and 120 increase since as data rates increase the timing margin for correctly sampling the data on the data line 101 at the sampling circuitry 126 becomes smaller.

Along with phase lock loop 214 is a loop 203 which is shown as compensating for the delay values of Delay A and Delay B. Ideally, there will be perfect or near-perfect compensation and the sampling circuitry 126 will sample the data on the data line 101 at such an instant that the correct data value will be read. Thus, the delay values of Delay A and Delay B are compensated but at the price of added complexity, cost, and power consumption.

Figure 3:
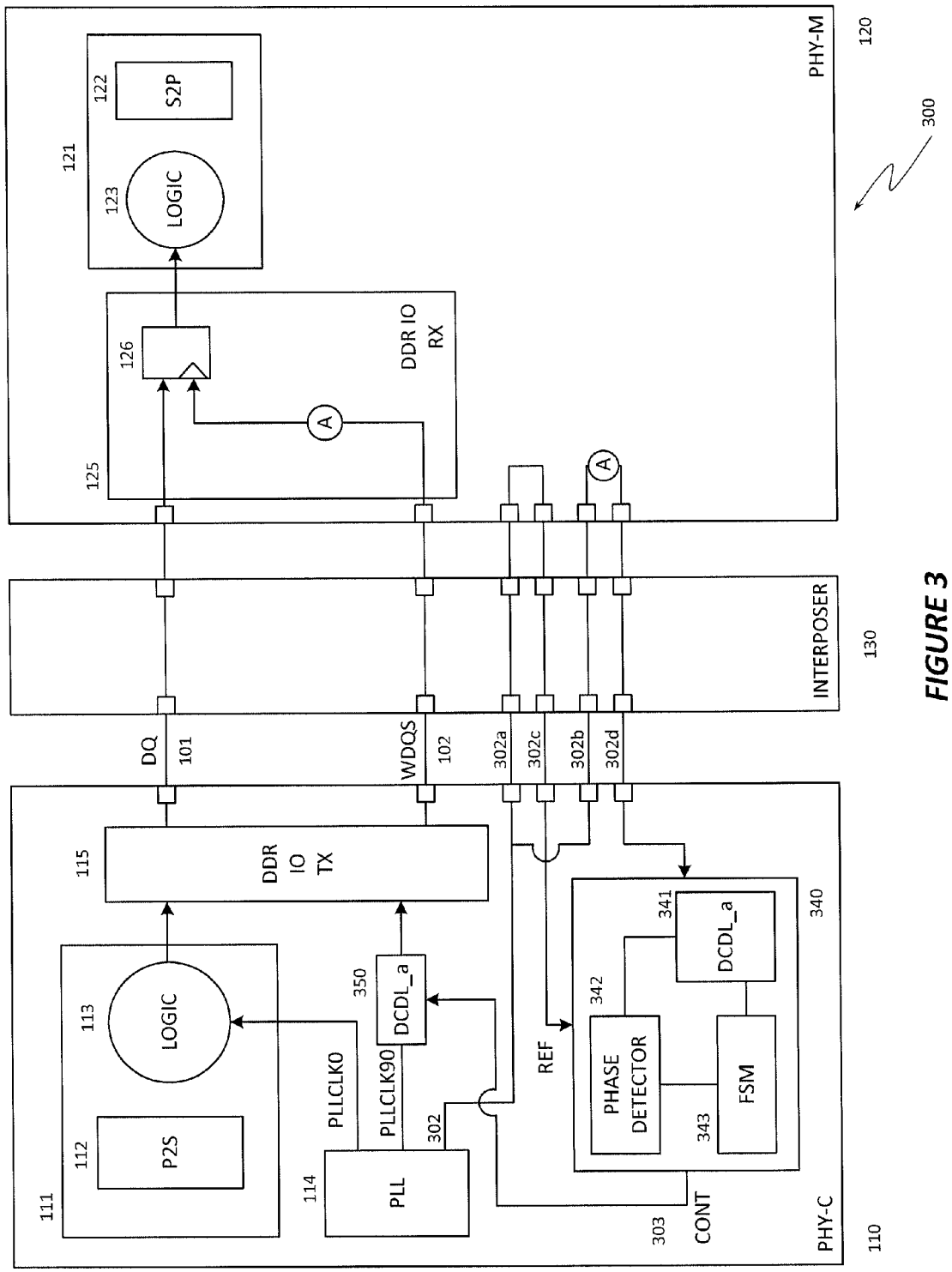
FIG. 3 is an illustration of a functional block diagram including additional circuitry and a calibration path according to an embodiment of the present subject matter.

With attention now drawn to FIG. 3, an illustration of a functional block diagram 300 is provided which includes additional circuitry and a calibration path, when compared with FIG. 1, according to an embodiment of the present subject matter as discussed below. In FIG. 3, a delay value Delay A is included in the clock line 102 going into the sampling circuitry 126. As discussed above, Delay A is conceptual in nature. In certain cases (e.g., high data rates, tight timing margin, etc.), the value of Delay A may cause a skew between the data on data line 101 and the clock signal on clock line 102 to produce misreading of the data when sampled by the sampling circuitry 126. Thus for those cases, compensation for Delay A is required. The delay value of Delay A is typically a known quantity and/or within a known range.

A calibration path is further provided which includes a calibration signal from phase lock loop 114 which is output on line 302 and splits into two loops: a reference loop and a calibration loop. The reference loop includes lines 302a and 302c and emulates the data line 101. The calibration loop includes lines 302b and 302d as well as a duplicate delay value Delay A. Thus, the calibration loop can emulate the delay experienced in the clock line 102. With respect to the reference loop, the calibration signal on line 302 is sent on line 302a from chip 110 through the interposer 130 to chip 120 and returns to chip 110 as shown via line 302c to be input into the phase detector 342 of DLL (delay lock loop) circuit device 340. For the calibration loop, the calibration signal on line 302 is sent on line 302b from chip 110 through the interposer 130 to chip 120 and returns to chip 110 as shown via line 302d to be input into the DCDL_a (digitally controllable delay line) 341 of DLL circuit device 340. The DLL circuit device 340 also includes a finite state machine 343, the operation of which will be discussed below with respect to FIG. 4. Within the DLL circuit device 340, each of the DCDL_a 341, the phase detector 342, and the finite state machine 343 is connected to the other two devices. The output of the DLL circuit device 340 is a control signal 303 which is input into DCDL_a 350 which is in the PLLCLK90 line from phase lock loop 114 to the transmission device 115, as shown.

Since the DCDL_a 350 is positioned in chip 110 rather than in chip 120, only one DCDL device is needed for each clock line 102 which traverses the two chips. If DCDL_a 350 were to be placed in chip 120, a separate DCDL device would be needed for each clock line 102. Additionally, placing the calibration path in chip 110 results in fewer lines needing to traverse the chips and the interposer 130. In embodiments of the present subject matter, more than one calibration path is contemplated.

Figure 4:
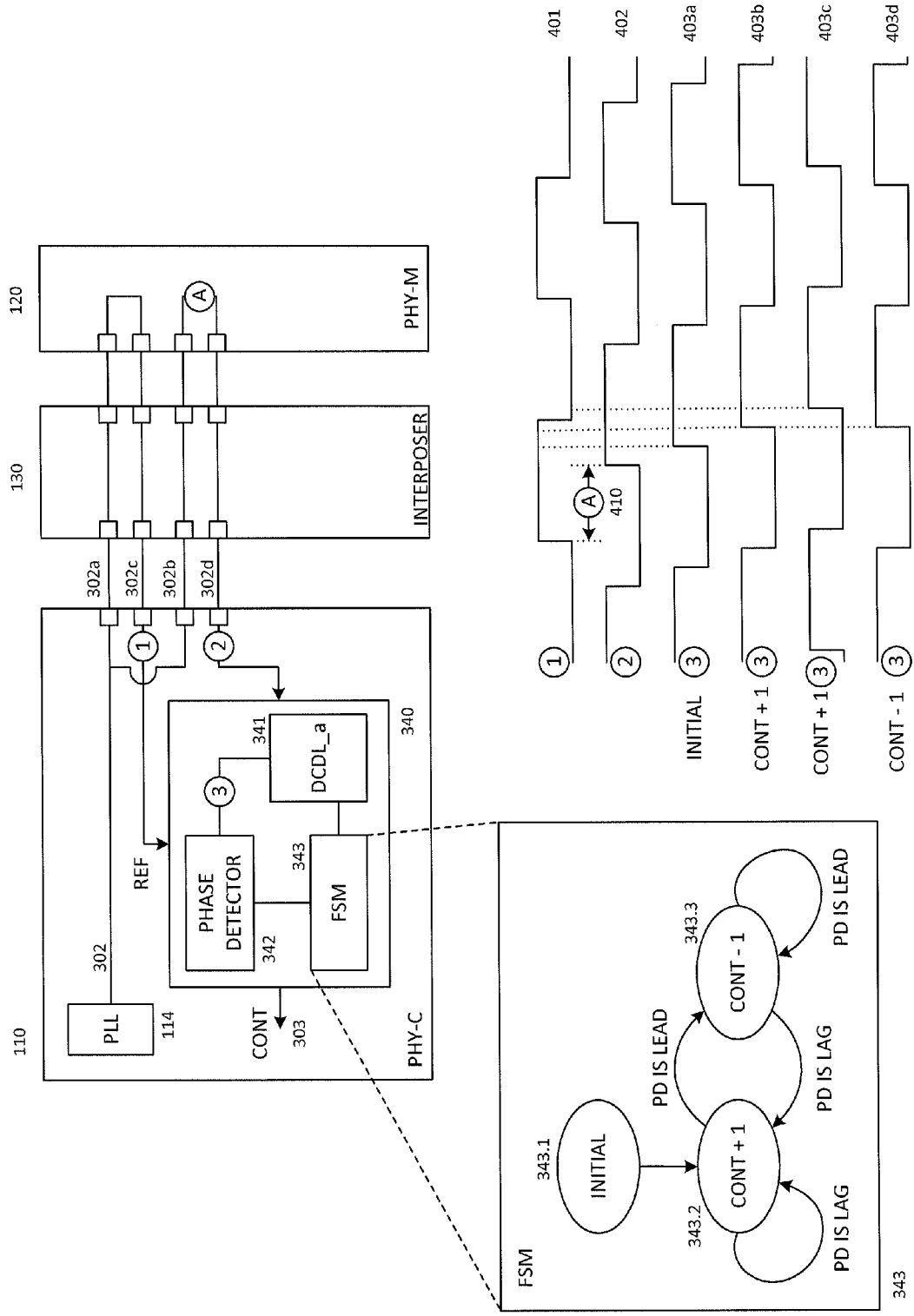
FIG. 4 is an illustration of the calibration path of FIG. 3 showing additional detail and exemplary waveforms.

Considering FIG. 4, the calibration path of FIG. 3 is shown (with the exception of DCDL_a 350) as well as detail regarding finite state machine 343. Additionally shown are exemplary waveforms at the locations 1, 2, and 3 where the locations are identified in FIG. 3 as the respective encircled number. As discussed above, the calibration signal 302 is split into the reference loop 302a and 302c and the calibration loop 302b and 302d, including the delay value Delay A. The reference loop is input to the phase detector 342 of the DLL circuit device 340 while the calibration loop is input to the DCDL_a 341. The output control signal 303 of the DLL circuit device 340 is also shown.

Since the calibration loop 302b and 302d contains a delay amount (Delay A) and the reference loop 302a and 302c does not contain this delay amount, the waveform 402 at location 2 is delayed from the waveform 401 at location 1 by the Delay A amount 410, as shown. The purpose of the DLL circuit device 340 is to compensate for the Delay A delay by inserting additional delay using DCDL_a 341 such that the waveform at the output of DCDL_a (i.e., at location 3) is as close to a ½ cycle delay from the waveform 401 as possible without exceeding ½ cycle delay. Ideally, the sum of the delays of Delay A and DCDL_a 341 is equivalent to a ½ cycle offset between the waveform at location 3 and the waveform at location 1 (e.g., the rising edge of the waveform at location 3 occurs at the same time as the falling edge of the waveform at location 1). Since Delay A is a constant value, DCDL_a may be adjusted to obtain the ½ cycle offset. However, some embodiments of the current subject matter do not require an exact ½ cycle offset.

As shown in FIG. 4, in an exemplary embodiment showing a simplified operation of the calibration path, the signal from the calibration loop is input to DCDL_a 341 and a preset delay value is inserted resulting in a signal at location 3 having waveform 403a. In certain embodiments, the preset delay value may be adjustable. The phase detector 342 detects the difference in phase (i.e., delay) between the reference loop signal (i.e., at location 1, waveform 401) and the output of DCDL_a 341 (i.e., at location 3, waveform 403a). This information is input to the finite state machine 343 as the initial difference 343.1. At this point, the finite state machine inserts an adjustment (i.e., "CONT+1") at 343.2 and a control signal is sent from the finite state machine to DCDL_a causing DCDL_a to increment an additional preset delay into the signal coming from the calibration loop. This additional preset delay causes the waveform at location 3 to be additionally delayed, as shown with respect to waveform 403b. The process above is repeated as the phase detector 342 detects the difference in phase between the waveform 401 and waveform 403b. This information is again sent to the finite state machine where, at 343.2, since the input from the phase detector indicates that waveform 403b is lagging waveform 401, a second adjustment is determined to be necessary. Thus, the finite state machine 343 sends a second control signal to DCDL_a 341 causing DCDL_a to again increment an additional preset delay into the signal coming from the calibration loop. This second additional preset delay causes the waveform at location 3 to be additionally delayed, as shown with respect to waveform 403c. Again, the process above is repeated as the phase detector 342 detects the difference in phase between the waveform 401 and waveform 403c. This information is again sent to the finite state machine where, at 343.2, the input from the phase detector indicates that waveform 403c is leading waveform 401. Thus, a further adjustment is determined to be necessary, this time by removing a preset delay (i.e., "CONT−1"), as shown at 343.3. Thus, in this example, the finite state machine 343 sends a third control signal to DCDL_a causing DCDL_a to decrement a preset delay into the signal coming from the calibration loop. Accordingly, the signal at location 3 is shown to have waveform 403d (which, due to the increment and decrement of the preset delay, is the same as the waveform 403b). The phase detector 342 compares the waveform 401 and the waveform 403d and sends this information to the finite state machine 343. This process may be repeated a predetermined number of times so that the waveform at location 3 alternately lags and leads (or leads and lags) the waveform at location 1 (401), thus indicating that the waveform at location 3 is in phase with the waveform at location 1. The finite state machine then sends a control signal 303 to DCDL_a 350 (as shown in FIG. 3) such that DCDL_a 350 causes a delay to be inserted in the PLLCLK90 line similar to the resultant delay inserted into the calibration loop by DCDL_a 341. The DLL circuit device 340 may then be turned off to reduce power consumption. Thus, the delay amount of Delay A in clock line 102 of FIG. 3 is compensated for as discussed below with respect to FIGS. 5 and 6.

Figure 5:
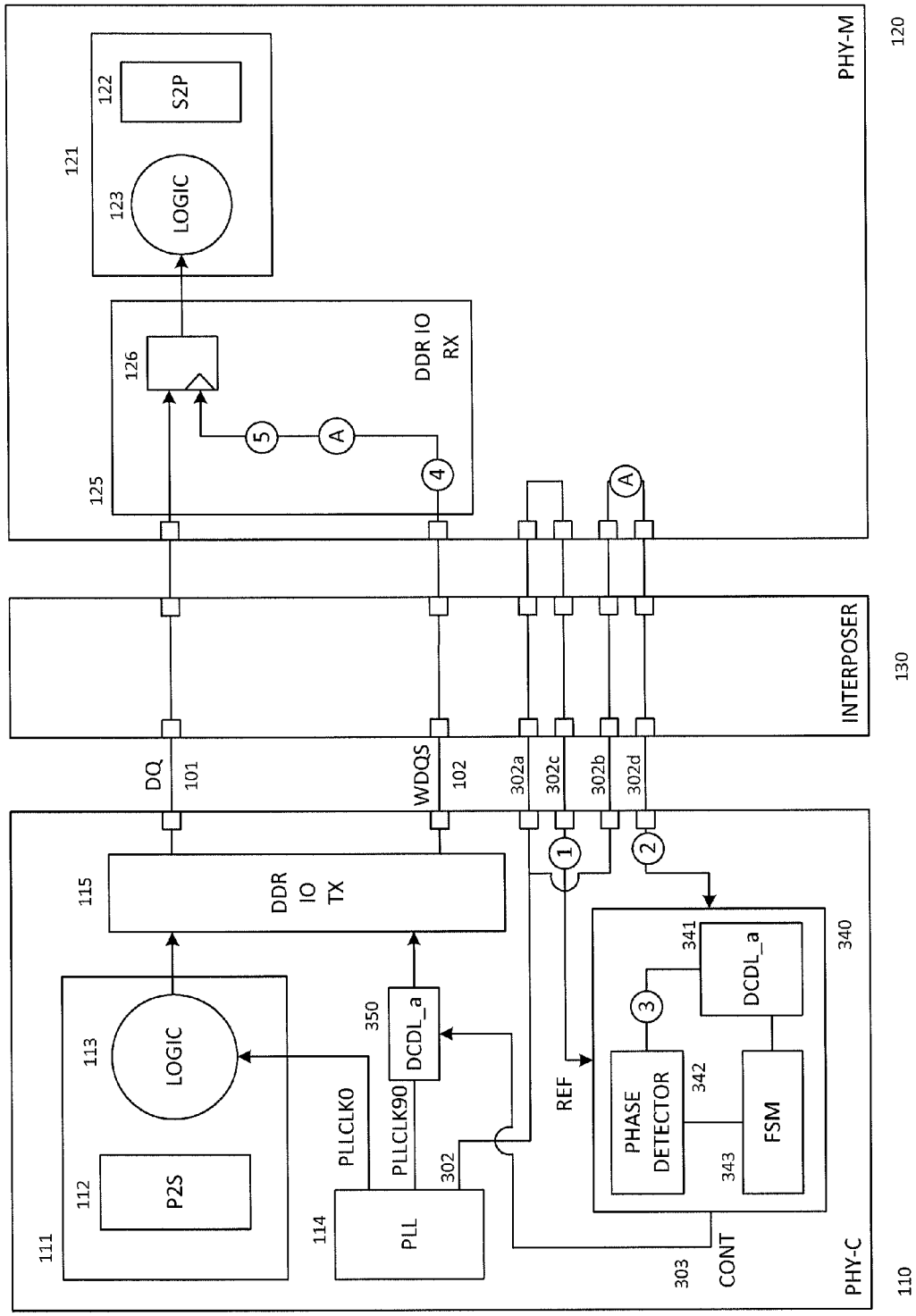
FIG. 5 depicts FIG. 3 with certain locations annotated.

FIG. 5 depicts FIG. 3 with annotations added for certain locations. As will be noted, the locations 1, 2, and 3 in FIG. 5 correspond to the locations 1, 2, and 3 discussed above with respect to FIG. 4. Additionally, location 4 is on clock line 102 after the DCDL_a 350 (and any delay inserted on the clock line 102 by DCDL_a 350) and prior to the addition of the conceptual delay Delay A. Location 5 is also on clock line 102 after the addition of the conceptual delay Delay A and prior to the sampling circuitry 126. Waveforms for these locations will be discussed below with respect to FIG. 6.

Figure 6:
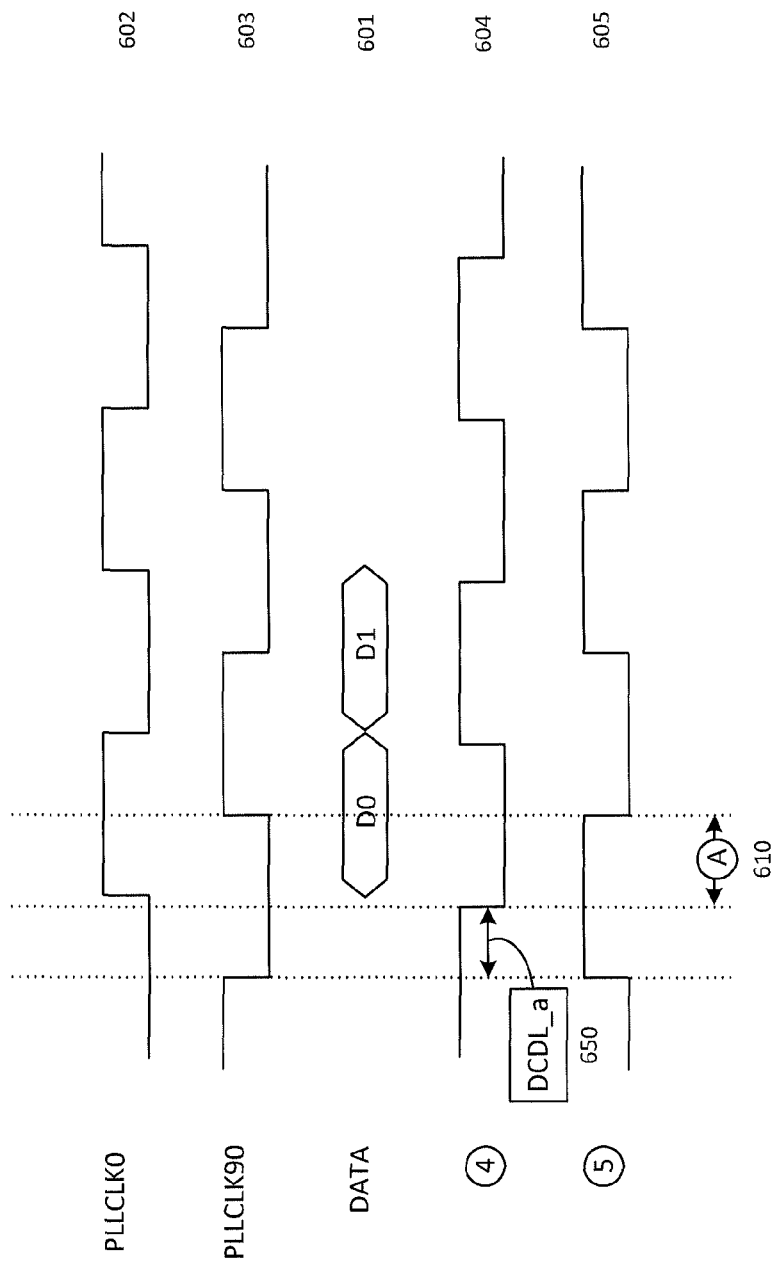
FIG. 6 illustrates waveforms at certain locations in FIG. 5.

FIG. 6 illustrates waveforms at certain locations in FIG. 5, specifically the waveform 602 for the PLLCLK0 signal, the waveform 603 for the PLLCLK90 signal, the waveform 604 for location 4, and waveform 605 for location 5. Additionally, FIG. 6 includes exemplary data 601 for data line 101, which is aligned with the PLLCLK0 signal. As stated above, the PLLCLK90 signal is delayed from the PLLCLK0 signal by ¼ cycle (i.e., 90°). Therefore, waveform 603 is offset from waveform 602 by ¼ cycle, as shown in FIG. 6. As can further be seen from FIG. 6, if there is no delay value Delay A and no added delay DCDL_a 650, then the sampling circuitry 126 of FIG. 5, which uses the clocking signal on clock line 102, correctly samples the data on data line 101 (where sampling occurs at the transition of the clocking signal).

From FIGS. 5 and 6, it can be seen that waveform 605 at location 5 is offset from waveform 604 at location 4 by the delay amount of Delay A 610. Additionally, waveform 604 at location 4 is offset from waveform 603 for the PLLCLK90 signal by the amount of delay DCDL_a 650 added by DCDL_a 350 of FIG. 5. Ideally, the sum amount of delay caused by Delay A 610 and DCDL_a 650 is ½ cycle from PLLCLK90, thus resulting in waveform 605 (which can be seen is the clock input to the sampling circuitry 126) to be offset from the data signal on line 101 (which is timed the same as the PLLCLK0 signal) by ½ cycle. The result is that the data 601 on the data line 101 is sampled correctly.

Figure 7:
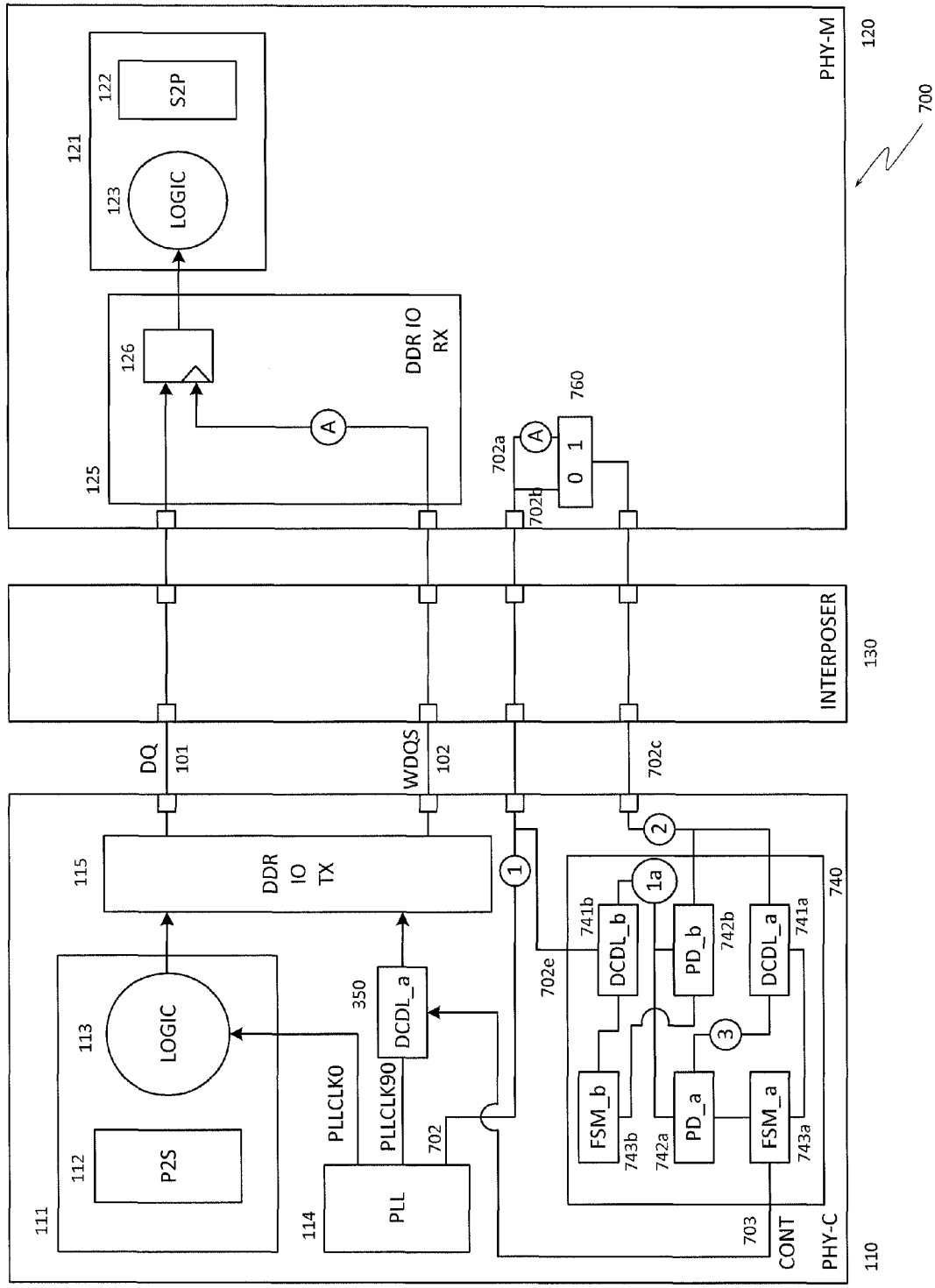
FIG. 7 is an illustration of a functional block diagram including additional circuitry and a calibration path according to another embodiment of the present subject matter.

Considering FIG. 7, illustration of a functional block diagram 700 is presented which includes additional circuitry and a calibration path according to another embodiment of the present subject matter. While the overall functionality and purpose of the embodiment depicted in FIG. 7 is the same as the embodiment depicted in FIG. 3, the embodiment depicted in FIG. 7 differs from the embodiment depicted in FIG. 3 in that the calibration path in FIG. 7 requires fewer lines traversing chip 110 interposer 130, and chip 120. Additionally, the DLL circuit device 740 includes additional circuitry from the DLL circuit device 340 of FIG. 3. The additional circuitry inn DLL circuit device 740 will be discussed below with respect to FIG. 8.

The calibration path in FIG. 7 is provided which includes a calibration signal from phase lock loop 114 which is output on line 702 which traverses to chip 120 where it splits into two loops: a reference loop 702b and a calibration loop 702a. Circuit device 760 effectuates the operation of the two loops. As a non-limiting example, if a binary 0 signal is applied to circuit device 760, the reference loop 702b is actuated where if a binary 1 signal is applied, the calibration loop 702a is actuated. The output of circuit device 760 travels along line 702c to the DLL circuit device 740. The calibration signal on line 702 also is applied to the DLL circuit device 740 via line 702e, as shown.

Since in this embodiment there is only one loop through the interposer 130, there is a need to determine the delay caused by the interposer. This is accomplished when the circuit device 760 receives a binary 0 signal thus enabling the reference loop 702b. When enabled, the reference loop allows the calibration signal on line 702 to loop from chip 110 through the interposer 130 to chip 120, through line 702b, and then back through the line 702c and be applied to the DLL circuit device 740 without being affected by Delay A. After the delay through the interposer 130 is calculated, the effect of Delay A can be determined. This is accomplished when the circuit device 760 receives a binary 1 signal thus enabling the calibration loop 702a. When enabled, the reference loop allows the calibration signal on line 702 to loop from chip 110 through the interposer 130 to chip 120, through line 702a—thus being effected by Delay A—and then back through the line 702c and applied to the DLL circuit device 740. Once the effect of Delay A is determined, a control signal 703 is sent to DCDL_a 350 in FIG. 7.

Figure 8:
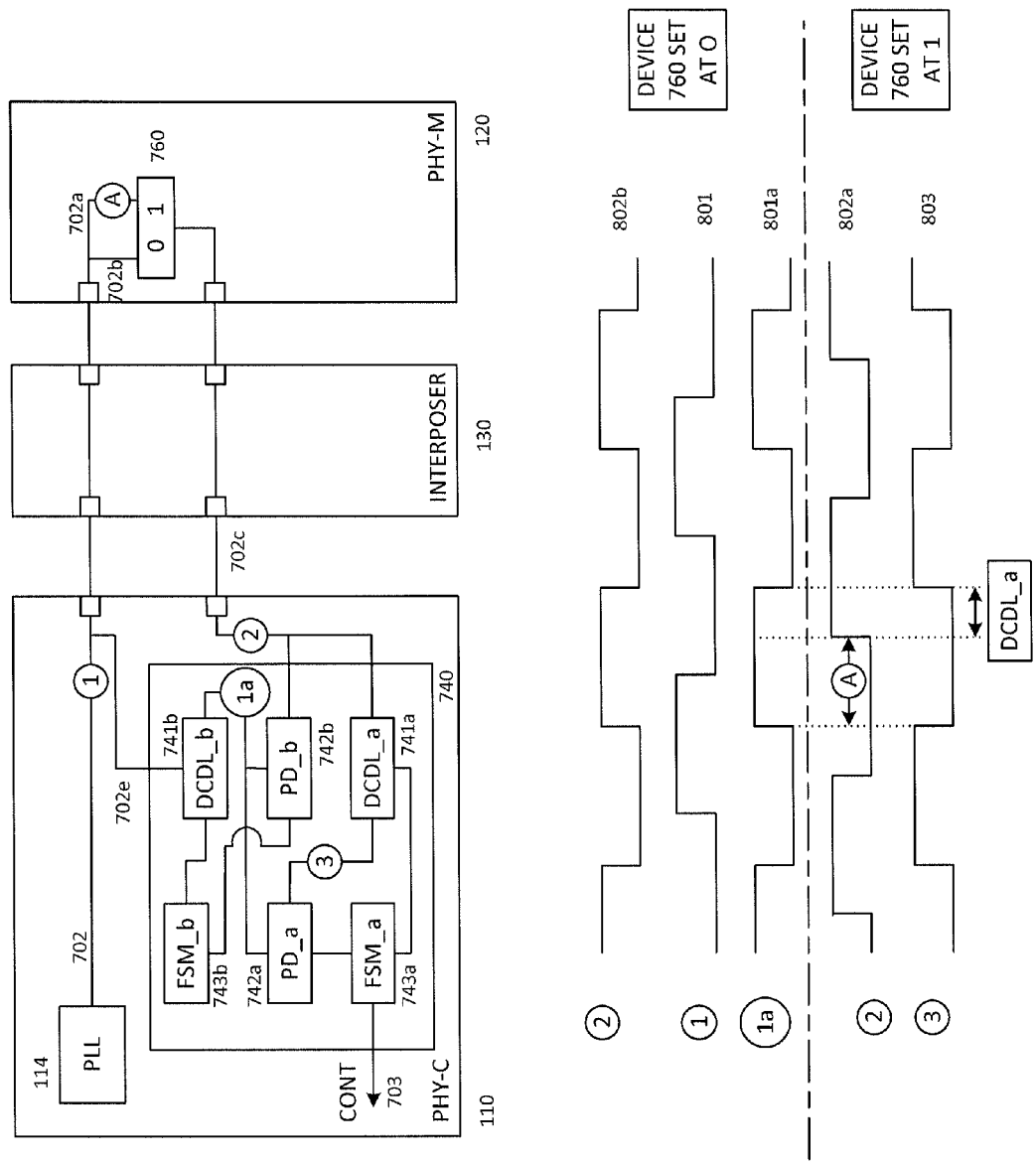
FIG. 8 is an illustration of the calibration path of FIG. 7 showing additional detail and exemplary waveforms.

With reference now focused on FIG. 8, illustrated therein is the calibration path of FIG. 7 showing additional detail and exemplary waveforms. The operation of the calibration path will now be described. Considering first the enabling of the reference loop 702b, the calibration signal on line 702 loops through line 702b and back through line 702c and is applied to phase detector 742b (PD_b). The calibration signal is also applied to DCDL_b, 741b, through line 702e. The operation of DCDL_b, 741b, phase detector 742b, and finite state machine (FSM_b), 743b, is similar to the operation described above with respect to the DLL circuit device 340 FIG. 4. The result is a waveform at location 1a. Shown in FIG. 8 is the relationship between waveform 801 (which is not effected by the delay through the interposer 130), the waveform 802b (which is effected by the delay through the interposer but is not effected by Delay A), and the waveform at location 1a.

Now, the circuit device 760 is switched so that the calibration loop 702a is enabled and the effect of Delay A is applied to line 702c. In this mode, the signal on line 702c is applied to DCDL_a, 741a, and the signal at location 1a is applied to phase detector (PD_a) 742a. The operation of DCDL_a, 741a, phase detector 742a, and finite state machine (FSM_a), 743a, is similar to the operation described above with respect to the DLL circuit device 340 FIG. 4. The result is a waveform at location 3. Shown in FIG. 8 is the relationship between waveform at location 1a (from the reference loop mode), the waveform at location 2 (which is effected by the delay through the interposer and by Delay A), and the waveform at location 3. A control signal 703 is then sent to DCDL_a 350 in FIG. 7 to compensate for the effect of Delay A in the clock line 102 entering the sampling circuitry 126.

Figure 9:
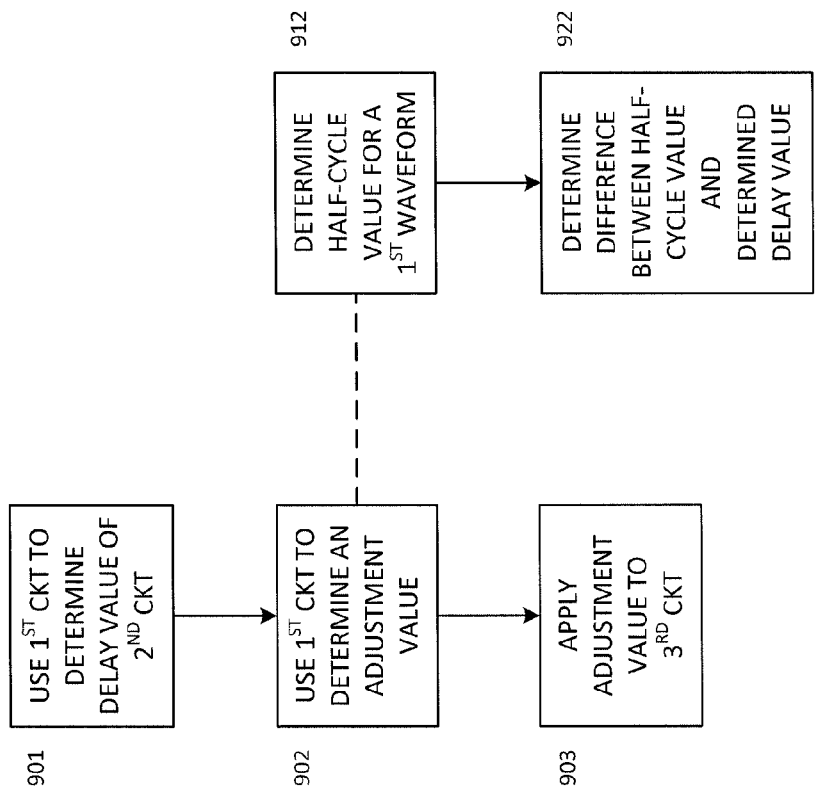
FIG. 9 is a flow chart for a method for correcting timing misalignments according to another embodiment of the present subject matter.

Now considering FIG. 9, a flow chart for a method for correcting timing misalignments according to another embodiment of the present subject matter is presented. In an embodiment for adjusting a timing parameter of a circuit, at block 901 a first circuit, for example, a calibration path as shown in any of the embodiments above, is used to determine a delay value of a second circuit, such as the delay value Delay A as described above. At block 902, the first circuit is used to determine an adjustment value, such as the delay introduced by the DCDL_a circuit in any of the embodiments above, where the adjustment value is based at least on the determined delay value. At block 903, the adjustment value is applied to a third circuit, such as the DCDL_a device 350 in any of the embodiments above.

In a further embodiment, the determining of the adjustment value includes, at block 912, determining a half-cycle value for a first waveform and, at block 922, determining a difference between the half-cycle value for the first waveform and the determined delay value.

Figure 10:
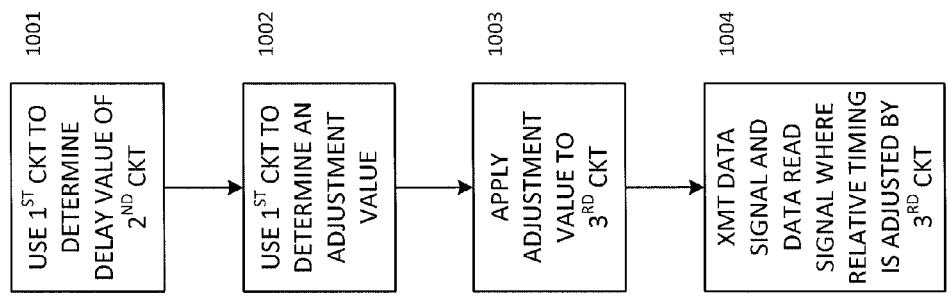
FIG. 10 is a flow chart for a method for correcting timing misalignments according to another embodiment of the present subject matter.

In FIG. 10, a flow chart for a method for correcting timing misalignments according to another embodiment of the present subject matter is presented. In an embodiment for adjusting a timing parameter of a circuit, at block 1001 a first circuit, for example, a calibration path as shown in any of the embodiments above, is used to determine a delay value of a second circuit, such as the delay value Delay A as described above. At block 1002, the first circuit is used to determine an adjustment value, such as the delay introduced by the DCDL_a circuit in any of the embodiments above, where the adjustment value is based at least on the determined delay value. At block 1003, the adjustment value is applied to a third circuit, such as the DCDL_a device 350 in any of the embodiments above. At block 1004, a data signal which includes at least one data bit is transmitted and a data read signal is transmitted, such as from chip 110 along data line 101 and clock line 102, respectively, for any of the embodiments above. The relative timing between the data signal and the data read signal is adjusted by the third circuit.

Embodiments of the present subject matter include a method for adjusting a timing parameter by using a first circuit to determine a delay value of a second circuit and to determine an adjustment value based on the determined delay value so that the adjustment value can be applied to a third circuit.

Further embodiments of the present subject matter include a system for adjusting a timing parameter where the system includes a first device having a calibration circuit which includes a first circuit which traverses the first device and a second device, a second circuit which traverses the first and second devices and includes a first delay value, and an adjustment circuit. The second device includes a data circuit which has a second predetermined delay value. The adjustment circuit determines an adjustment value based on at least the first delay value and applies the adjustment value to a third circuit.

Still further embodiments of the present subject matter include a system for adjusting a timing parameter where the system includes a first device having a calibration circuit which includes an adjustment circuit and a loop circuit which traverses the first device and a second device, where the loop circuit includes a first loop and a second loop where the second loop includes a first delay value. The second device includes a data circuit which has a second predetermined delay value. The adjustment circuit determines an adjustment value based on at least the first delay value and applies the adjustment value to a third circuit.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A method for adjusting a timing parameter, the method comprising the steps of:
   (a) determining, using a delay-locked loop circuit, a delay value of a second circuit;
   (b) determining, using the delay-locked loop circuit, an adjustment value based at least on the determined delay value;
   (c) applying the adjustment value to a third circuit; and
   (d) transmitting a data signal comprising at least one data bit, and transmitting a data read signal, wherein a relative timing between the data signal and the data read signal is adjusted by the third circuit.

2. The method of claim 1 wherein the step of determining the delay value includes determining a lag value between a leading edge of a first waveform and a leading edge of a second waveform.

3. The method of claim 2 wherein the step of determining the adjustment value includes:
   (i) determining a half-cycle delay value for a first waveform; and
   (ii) determining a difference between the half-cycle delay value for the first waveform and the determined delay value.

4. The method of claim 2 wherein the lag value is a phase difference.

5. A system for adjusting a timing parameter, comprising:
   a first device;
   a second device; and
   a calibration circuit, said calibration circuit comprising:
      a first circuit that is formed at least partially on said first device and at least partially on said second device;
      a second circuit that is formed at least partially on said first device and at least partially on said second device and includes a first delay value; and
      a delay-locked loop circuit;
   said second device comprising a data circuit having a second predetermined delay value;
   wherein said delay-locked loop circuit determines an adjustment value based at least on said first delay value, and
   wherein said delay-locked loop circuit applies said adjustment value to a third circuit.

6. The system of claim 5 wherein said first device and said second device are separated by an interposer and said first and second circuits are at least partially formed on said interposer.

7. The system of claim 5 wherein said third circuit is a digitally-controlled delay line.

8. The system of claim 5 wherein said delay-locked loop circuit determines said first delay value based on a difference between reception of a leading edge of a first waveform which passes through said first circuit and reception of a leading edge of a second waveform which passes through said second circuit.

9. The system of claim 8 wherein said adjustment value is further determined based on a difference between a half-cycle delay value for said first waveform and said determined first delay value.

10. The system of claim 5 wherein said first device further comprises said third circuit.

11. The system of claim 5 wherein said first device comprises a data transmission circuit for sending a data signal comprising at least one data bit, and a data read signal to said second device, and
wherein said second device comprises a data receiving circuit which receives said data signal and said data read signal, wherein said data read signal is delayed from said data signal by said second predetermined delay value.

12. A system for adjusting a time parameter, comprising:
a first device;
a second device; and
a calibration circuit, said calibration circuit comprising:
a delay-locked loop circuit; and
a loop circuit that is formed at least partially on said first device and at least partially on said second device, said loop circuit comprising:
a first loop; and
a second loop which includes a first delay value; and
said second device comprising a data circuit having a second predetermined delay value;
wherein said delay-locked loop circuit determines an adjustment value based at least on said first delay value, and
wherein said delay-locked loop circuit applies said adjustment value to a third circuit.

13. The system of claim 12 wherein said first device and said second device are separated by an interposer and said loop circuit is formed at least partially on said interposer.

14. The system of claim 12 wherein said third circuit is a digitally-controlled delay line.

15. The system of claim 12 wherein said delay-locked loop circuit determines said first delay value based on a difference between reception of a leading edge of a first waveform which passes through said first loop and reception of a leading edge of a second waveform which passes through said second loop.

16. The system of claim 15 wherein said adjustment value is further determined based on a difference between a half-cycle delay value for said first waveform and said determined first delay value.

17. The system of claim 12 wherein said first device further comprises said third circuit.

18. The system of claim 12 wherein said first device comprises a data transmission circuit for sending a data signal comprising at least one data bit, and a data read signal to said second device, and
wherein said second device comprises a data receiving circuit which receives said data signal and said data read signal, wherein said data read signal is delayed from said data signal by said second predetermined delay value.

19. A method for adjusting a timing parameter, the method comprising the steps of:

(a) determining, using a first circuit, a delay value of a second circuit, wherein determining the delay value includes determining a lag value between a leading edge of a first waveform and a leading edge of a second waveform;
(b) determining, using the first circuit, an adjustment value based at least on the determined delay value, wherein determining the adjustment value includes:
(i) determining a half-cycle delay value for the first waveform; and
(ii) determining a difference between the half-cycle delay value for the first waveform and the determined delay value; and
(c) applying the adjustment value to a third circuit.

20. A system, comprising:
a first device;
a second device;
a calibration circuit, said calibration circuit comprising:
a first circuit that is formed at least partially on said first device and at least partially on said second device;
a second circuit that is formed at least partially on said first device and at least partially on said second device and includes a first delay value; and
an adjustment circuit;
said second device comprising a data circuit having a second predetermined delay value;
wherein said adjustment circuit determines an adjustment value based at least on said first delay value, and
wherein said adjustment circuit applies said adjustment value to a digitally-controlled delay line.

21. A system, comprising:
a first device including a data transmission circuit for sending a data signal comprising at least one data bit and a data read signal;
a second device including a data receiving circuit for receiving the data signal and the data read signal; and
a calibration circuit, said calibration circuit comprising:
a first circuit that is formed at least partially on said first device and at least partially on said second device;
a second circuit that is formed at least partially on said first device and at least partially on said second device and includes a first delay value; and
an adjustment circuit;
said second device comprising a data circuit having a second predetermined delay value;
wherein said adjustment circuit determines an adjustment value based at least on said first delay value,
wherein said adjustment circuit applies said adjustment value to a third circuit, and
wherein the data read signal is delayed from the data signal by the second predetermined delay value.

* * * * *